United States Patent [19]

Choi

[11] Patent Number: 5,943,259

[45] Date of Patent: Aug. 24, 1999

[54] DATA SENSING DEVICE AND METHOD FOR MULTIBIT MEMORY CELL

[75] Inventor: Woong Lim Choi, Chungcheongbuk-do, Rep. of Korea

[73] Assignee: LG Semicon Co., Ltd., Chungcheongbuk-Do, Rep. of Korea

[21] Appl. No.: 09/000,610

[22] Filed: Dec. 30, 1997

[30] Foreign Application Priority Data

Dec. 30, 1996 [KR] Rep. of Korea ................... 96-76873

[51] Int. Cl.$^6$ ................................................. G11C 16/04
[52] U.S. Cl. ........................ 365/185.03; 365/233; 365/191
[58] Field of Search ..................... 365/185.03, 230.08, 365/194, 210, 189.07, 189.09, 184, 185.2, 233, 236, 191

[56] References Cited

U.S. PATENT DOCUMENTS

| | | | |
|---|---|---|---|
| 4,331,968 | 5/1982 | Gosney, Jr. et al. | 357/23 |
| 5,043,940 | 8/1991 | Harari | 365/168 |
| 5,047,362 | 9/1991 | Bergemont | 437/52 |
| 5,163,021 | 11/1992 | Mehrotra et al. | 365/185 |
| 5,257,220 | 10/1993 | Shin et al. | 365/49 |
| 5,268,318 | 12/1993 | Harari | 437/43 |
| 5,394,362 | 2/1995 | Banks | 365/189.01 |
| 5,422,842 | 6/1995 | Cernea et al. | 365/185 |
| 5,508,958 | 4/1996 | Fazio et al. | 365/185.19 |
| 5,687,114 | 11/1997 | Khan | 365/185.03 |
| 5,828,616 | 10/1998 | Bauer et al. | 365/210 |

OTHER PUBLICATIONS

Raul Cernea, et al., TA 7.4: *A 34Mb 3.3V Serial Flash EEPROM for Solid–State Disk Applications*, 1995 IEEE International Solid–State Circuits Conference, Feb. 1995, pp. 126–127, and 350 M. Baurer, et al., TA 7.7: *A Multi-level–Cell 32Mb Flash Memory*, 1995 IEEE International Solid–State CIrcuits Conference, Feb. 1995, pp. 132–133, and 351.

*Primary Examiner*—David Nelms
*Assistant Examiner*—Thong Le
*Attorney, Agent, or Firm*—Morgan, Lewis & Bockius LLP

[57] ABSTRACT

A device for sensing a data in a multibit memory cell includes a reference voltage generating part for generating a plurality of reference voltages, a switching part for successively applying the plurality of reference voltages from the reference voltage generating part to a control gate on the multibit memory cell, a sensing part for comparing the data recorded in the multibit memory cell to the reference voltages when each of the plurality of reference voltages is applied thereto, a controlling part for generating a plurality of reference voltage selection signals to control the switching part, and applying a highest reference voltage to the clock signal controlling part so that the data is produced in response to a clock signal from the clock signal controlling part, and a clock signal controlling part for subjecting a signal from the sensing part and a highest reference voltage selecting signal to a logical operation in controlling an external main clock signal, and a latching part for latching the data from the controlling part.

21 Claims, 8 Drawing Sheets

F I G.4
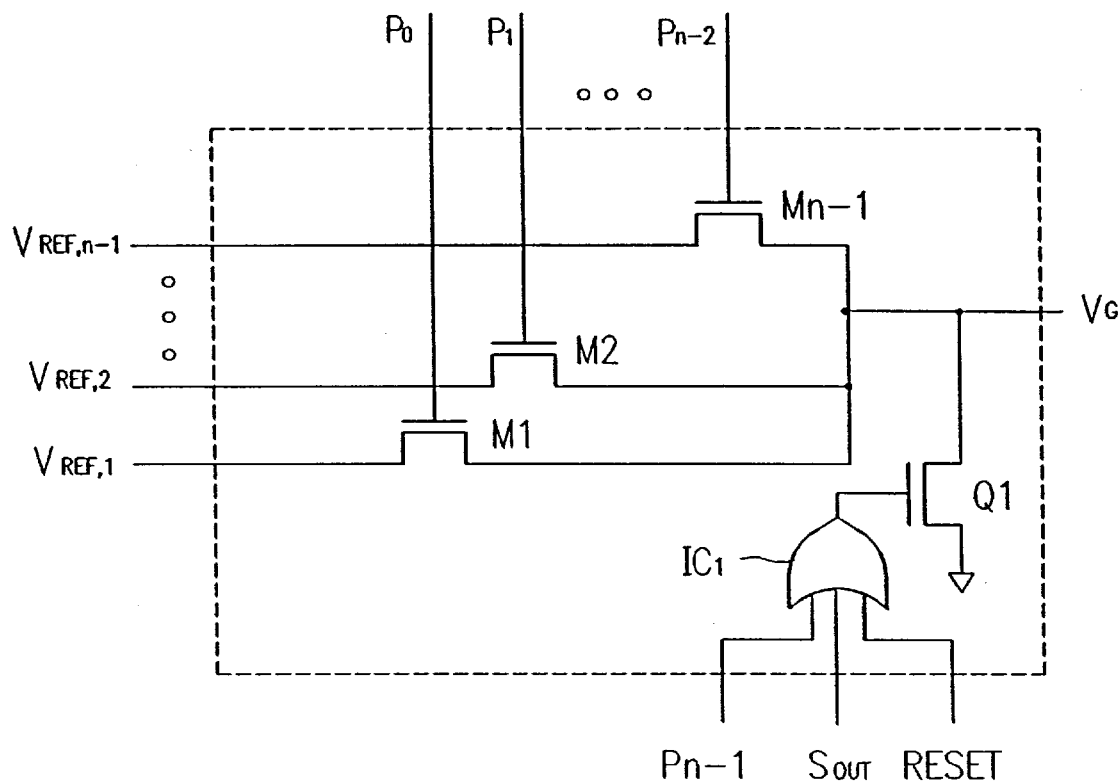
F I G.5
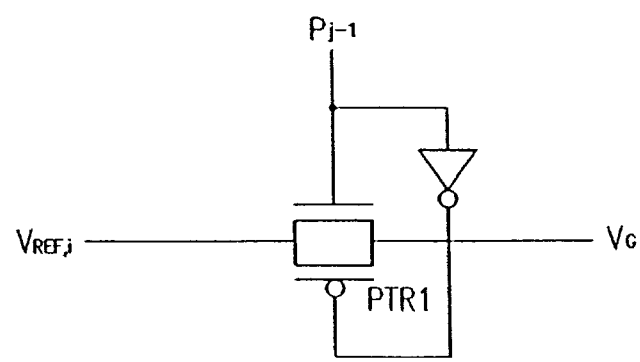

F I G.8
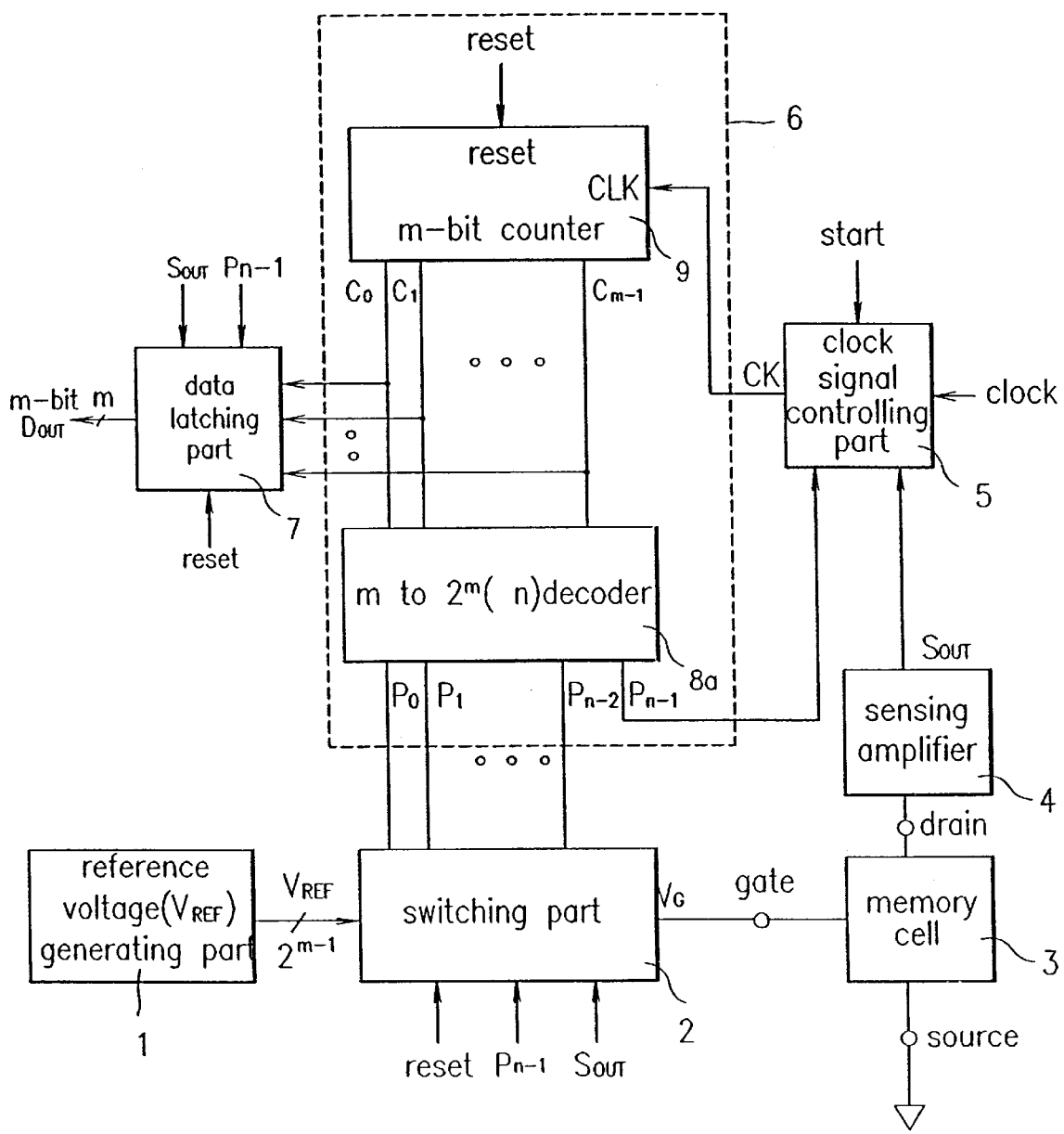

F I G.9
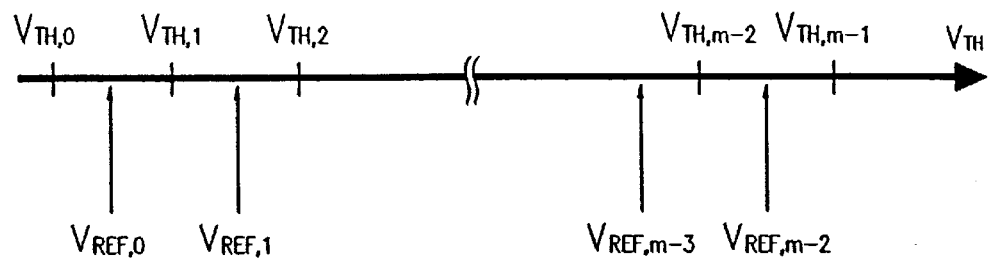
F I G.10
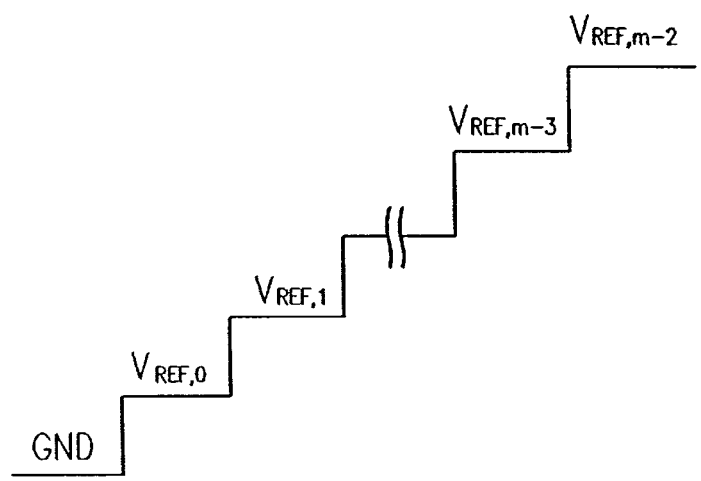
F I G.11
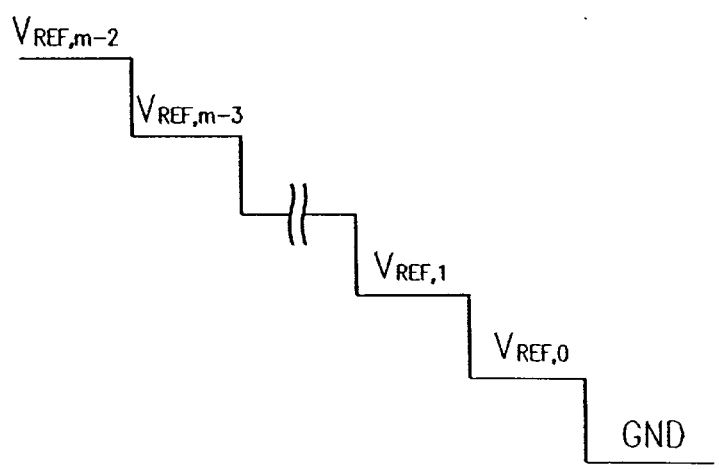

F I G.12
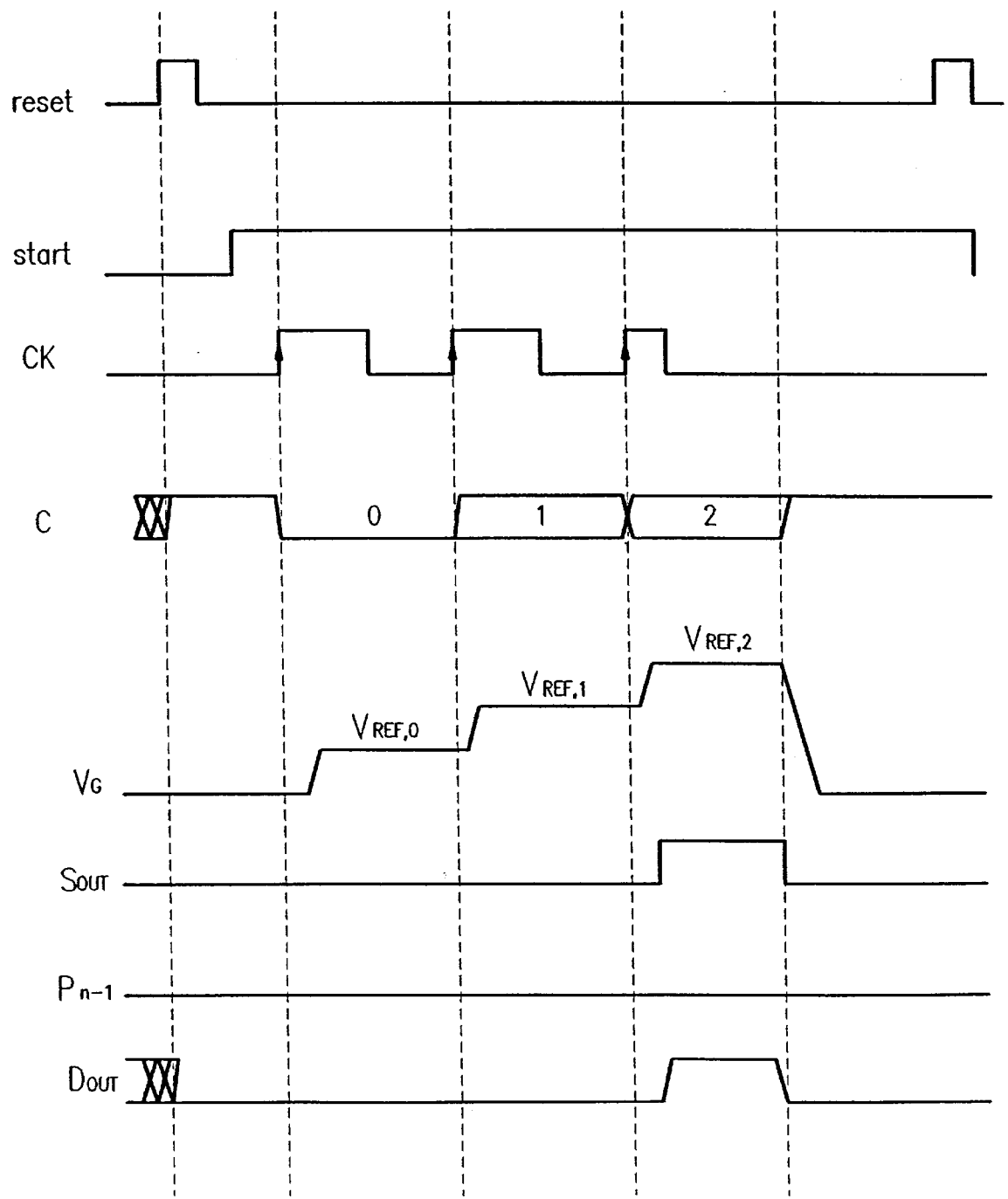

DATA SENSING DEVICE AND METHOD FOR MULTIBIT MEMORY CELL

This application claims the benefit of Korean Application No. 76873/1996 filed on Dec. 30, 1996, which is hereby incorporated by reference.

BACKGROUND OF THE INVENTION

1. Field of the Invention

The present invention relates to a device and method for reading information stored in a semiconductor device, and more particularly, to a data sensing device and method to be used with a multibit memory cell for reading data programmed in multilevel and stored in the multibit memory cell.

2. Discussion of the Related Art

Semiconductor memories generally include volatile memories and non-volatile memories. For volatile memories, information can be recorded and later erased. For non-volatile memories, once information is recorded, it can be conserved permanently. Volatile memories generally include RAM to/from which data is recordable and readable. Non-volatile memories include ROM, erasable programmable ROM (EPROM), and electrically erasable programmable ROM (EEPROM). ROM is a memory which is no longer programmable once information is recorded. EPROM and EEPROM are memories from/to which information is erasable and recordable. EPROM and EEPROM are identical in their programming operations, but different in their information erasing operations. Information recorded in EPROM is erased by an ultra-violet beam and information stored in EEPROM is erased electrically.

Of all memories, dynamic random access memory (DRAM) is the most widely used as a mass storage media because it provides large sized memories which are required by the information industry. However, DRAM requires a large size storage capacitor. In addition, it has the disadvantage that refreshing operations of the capacitor are required in certain intervals.

As a result, there have been many studies on using EEPROM instead of DRAM, since EEPROM does not require any refreshing operations. However, since EEPROM generally stores data of either "1" or "0" in a memory cell, its device packing density is related to the number of the memory cells in one to one fashion. Therefore, the drawback in using EEPROM as a data storage media is the high cost per bit of memory.

To solve this problem, active studies on multibit-per-cell devices are currently underway. A multibit memory cell stores data of over two bits in one memory cell, thus enhancing the data density on a single chip area without increasing the size of the memory cell. For the multibit memory cell, more than two threshold voltage levels should be programmed on a respective cell. For instance, in order to store two bits of data for every cell, the respective cells must be programmed in $2^2$ (i.e., 4) threshold levels. Here, the four threshold levels correspond to logic states 00, 01, 10 and 11, respectively. By precisely adjusting the respective threshold levels, more levels can be programmed, which in turn increases the number of bits for every cell. As a result, the data thus programmed in multilevels can be read in quickly.

A conventional data sensing device for sensing data programmed in multilevels will now be explained with reference to the attached drawings. FIG. 1 illustrates a system including a conventional sensing device for sensing a multibit memory cell, and FIG. 2 is a graph showing the operation of the conventional sensing device. Generally, when voltages which are large enough to cause reading are applied to a control gate, a current flows between a drain and a source. The current is then compared to a reference current and the comparison result determines the data reading operation. Referring to FIG. 1, a conventional system includes a sensing amplifier (SA) connected to a drain region D in a unit cell of an EEPROM, and the unit cell has a floating gate FG, a control gate CG, a source region S and the drain region D. The sensing amplifier SA has a plurality of reference currents therein.

A method of sensing data in a multibit memory cell having the aforementioned conventional system will now be explained.

It is assumed that the memory cell has been programmed in multilevel threshold voltages. That is, as shown in FIG. 2, when recording a two-bit data, it is assumed that the two-bit data has being programmed in the floating gate FG as one of four threshold voltages $V_{T0}$, $V_{T1}$, $V_{T3}$, $VT_4$. When a constant voltage is applied to the source region S, a predetermined voltage $V_{READ}$ is selectively applied to the control gate CG of the memory cell. Then, according to the programmed state of the floating gate FG, a drain current $I_D$ (see FIG. 1) corresponding to the programmed state flows through the sensing amplifier SA. The sensing amplifier SA compares the drain current $I_D$ from the memory cell to the multilevel reference currents within the sensing amplifier SA, thereby reading the data. That is, referring to FIG. 2, if the floating gate FG of a memory cell in an EEPROM has been programmed at the threshold voltage $V_{T0}$, a drain current $I_{R0}$ corresponding to the threshold voltage $V_{T0}$ will flow through the sensing amplifier SA. Similarly, if the floating gate FG has been programmed at the threshold voltage $V_{T1}$, a drain current $I_{R1}$ corresponding to the threshold voltage $V_{T1}$ will flow through the sensing amplifier SA. If the floating gate FG has been programmed at the threshold voltage $V_{T2}$, a drain current $I_{R2}$ corresponding to the threshold voltage $V_{T2}$ will flow through the sensing amplifier SA. Therefore, upon receiving the drain current from the drain of the memory cell, the sensing amplifier SA senses the data by comparing the drain current with the multilevel reference currents within the sensing amplifier SA.

Because a predetermined voltage Vc of a readable condition is applied to the control gate of a memory cell from which a data is to be read, and a multilevel comparison of the drain current from the memory cell is performed in the sensing amplifier in reading the data, the conventional data sensing device and method for sensing a data in a multibit memory cell have the following problems.

First, to perform the multilevel comparison of the drain current in the sensing amplifier when reading the data, the sensing amplifier must have the multilevel reference currents. This increases the size of the sensing amplifier, particularly in a page mode READ, which requires more bits (for example, 512 bits, 128 bits). Consequently, the chip size is increased. Second, the required multilevel reference currents in the sensing amplifier increase the overall power consumption.

SUMMARY OF THE INVENTION

Accordingly, the present invention is directed to a data sensing device and method for a multbit memory cell that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the data sensing device for a multibit memory cell includes a reference voltage generating part for generating a plurality of reference voltages, a switching part for successive application of the plurality of reference voltages from the reference voltage generating part to a control gate on a memory cell, a sensing part for comparing a data recorded in the memory cell to the reference value every time each of the reference voltages is applied thereto, a clock signal controlling part for subjecting a signal from the sensing part and a highest reference voltage selecting signal to logical operation in controlling an external main clock signal, a controlling part for controlling the switching part to generate the reference voltages in succession, and controlling the highest voltage to be applied to the clock signal controlling part so that the data is produced in response to a clock signal from the clock signal controlling part, and a latching part for latching the data from the controlling part.

In another aspect, a method for sensing data in a multibit memory cell includes the steps of receiving an external main clock signal, successive latching of data in response to the main clock signal, successive application of a plurality of reference voltages to a control gate on a memory cell, sensing the memory cell whenever each of the reference voltages is applied to the memory cell, detecting a time when an output of the sensing part is changed for blocking the main clock signal, and presenting a data latched by a most recent clock signal as a programmed data in the memory cell.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4 is a detail circuit of a first embodiment of the switching part shown in FIG. 3;

FIG. 5 is a detail circuit of a second embodiment of the switching part shown in FIG. 3;

FIG. 8 is a block diagram of a device for sensing data in a multibit memory cell in accordance with a second embodiment of the present invention;

FIG. 9 is a graph showing the threshold levels of an m-bit cell and the corresponding reference voltages in accordance with the present invention;

FIG. 10 is a graph showing the reference voltage selection in the first embodiment of the present invention;

FIG. 11 is a graph showing the reference voltage selection in the second embodiment of the present invention;

FIG. 12 is a timing diagram of different parts when the memory cell of the present invention is programmed in a threshold level $V_{TH2}$.

DETAILED DESCRIPTION OF THE PREFERRED EMBODIMENTS

Reference will now be made in detail to the preferred embodiments of the present invention, examples of which are illustrated in the accompanying drawings.

Figure 1:
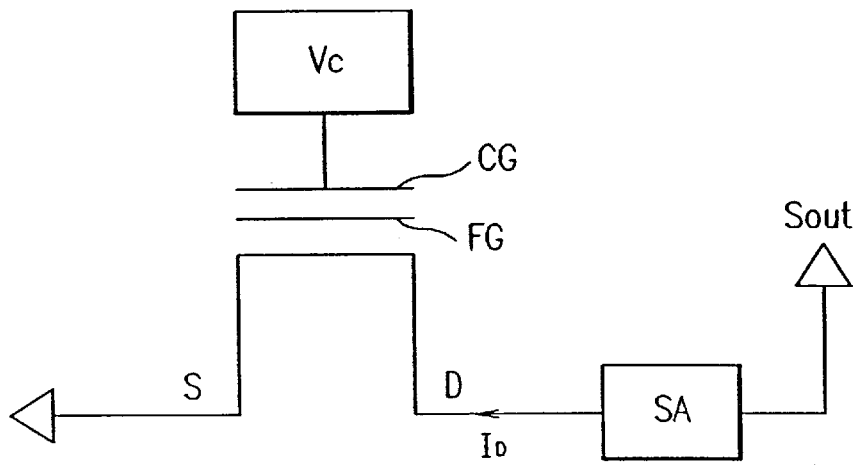
FIG. 1 is a conventional sensing device system for sensing a multibit memory cell.
Figure 2:
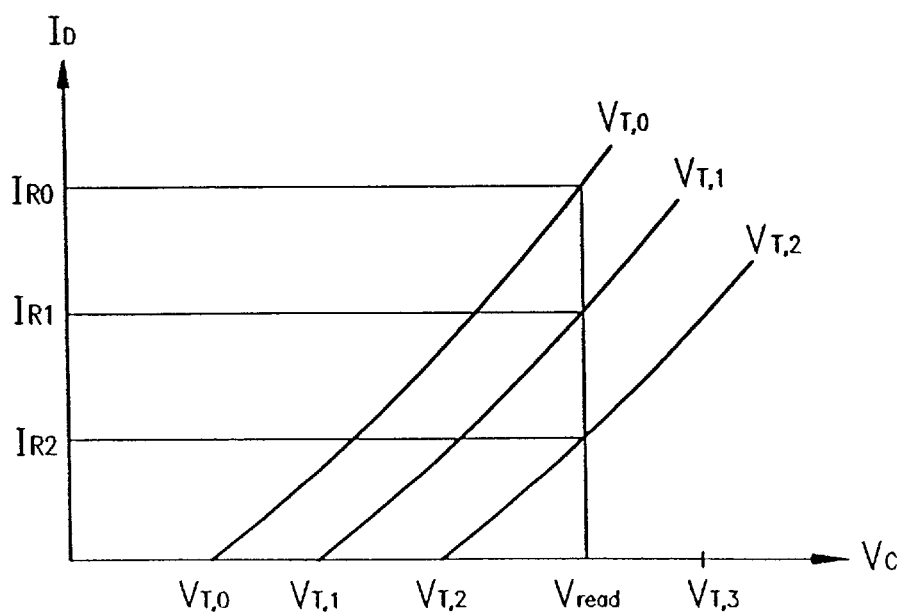
FIG. 2 is a graph showing the operation of the conventional sensing device.
Figure 3:
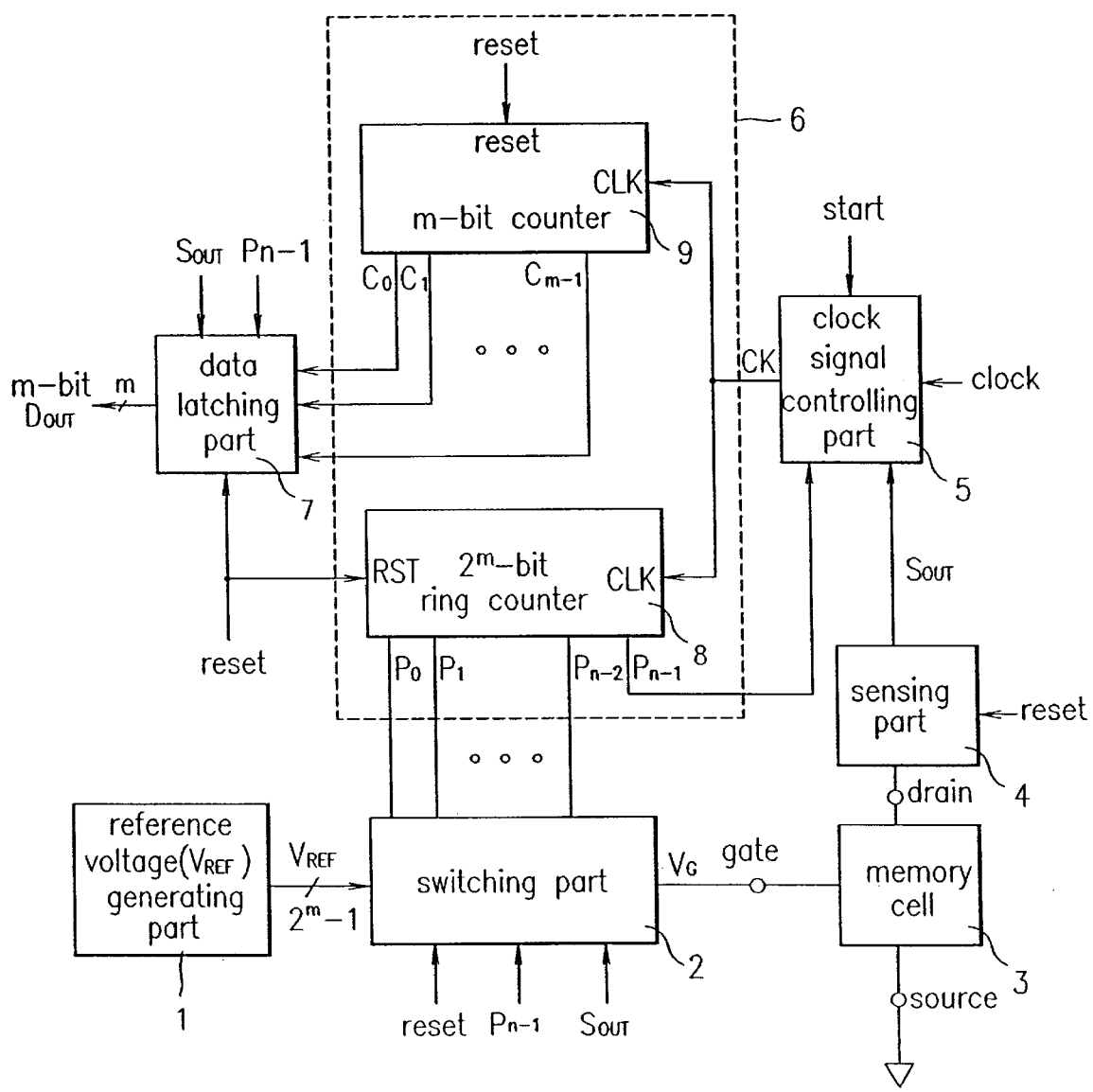
FIG. 3 is a block diagram of a device for sensing data in a multibit memory cell in accordance with a first embodiment of the present invention.

FIG. 3 is a block diagram of a device for sensing data in a multibit memory cell in accordance with a first embodiment of the present invention.

Referring to FIG. 3, the data sensing device of the present invention includes a reference voltage generating part 1 for generating a plurality of reference voltages ($2^m$-1 reference voltages for m-bits of data per cell). A switching part 2 applies the plurality of reference voltages from the reference voltage generating part 1 to a control gate in a memory cell 3 in succession (i.e., one by one), under the control of a controlling part 6 which is to be explained later. A sensing part 4 compares the data recorded in the memory cell 3 to a reference value. A clock signal controlling part 5 receives a signal from the sensing part 4 and a highest voltage selection signal from the controlling part 6 and performs a logical operation in controlling an external main clock signal. The controlling part 6 applies a reference voltage selection signal to the switching part 2 to control the reference voltages generated in succession (in the order of from a lower reference voltage to a higher reference voltage or vice versa) and produces a data in response to a clock signal from the clock signal controlling part 5. A data latching part 7 latches the data from the controlling part 6.

The controlling part 6 includes a ring counter 8 for counting the clock signal from the clock signal controlling part in generating the reference signal selection signals $P_0$, $P_1$ - - - $P_{n-2}$, and $P_{n-1}$ (with n=$2^m$), and an m-bit counter 9 for counting the clock signal from the clock signal controlling part 5 in producing the relevant data.

Figure 6:
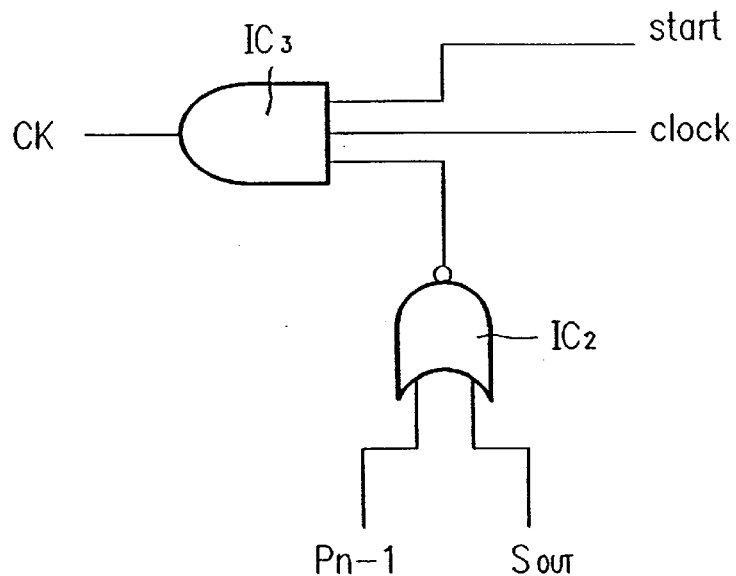
FIG. 6 is a detail circuit of the clock signal controlling part shown in FIG. 3.
Figure 7:
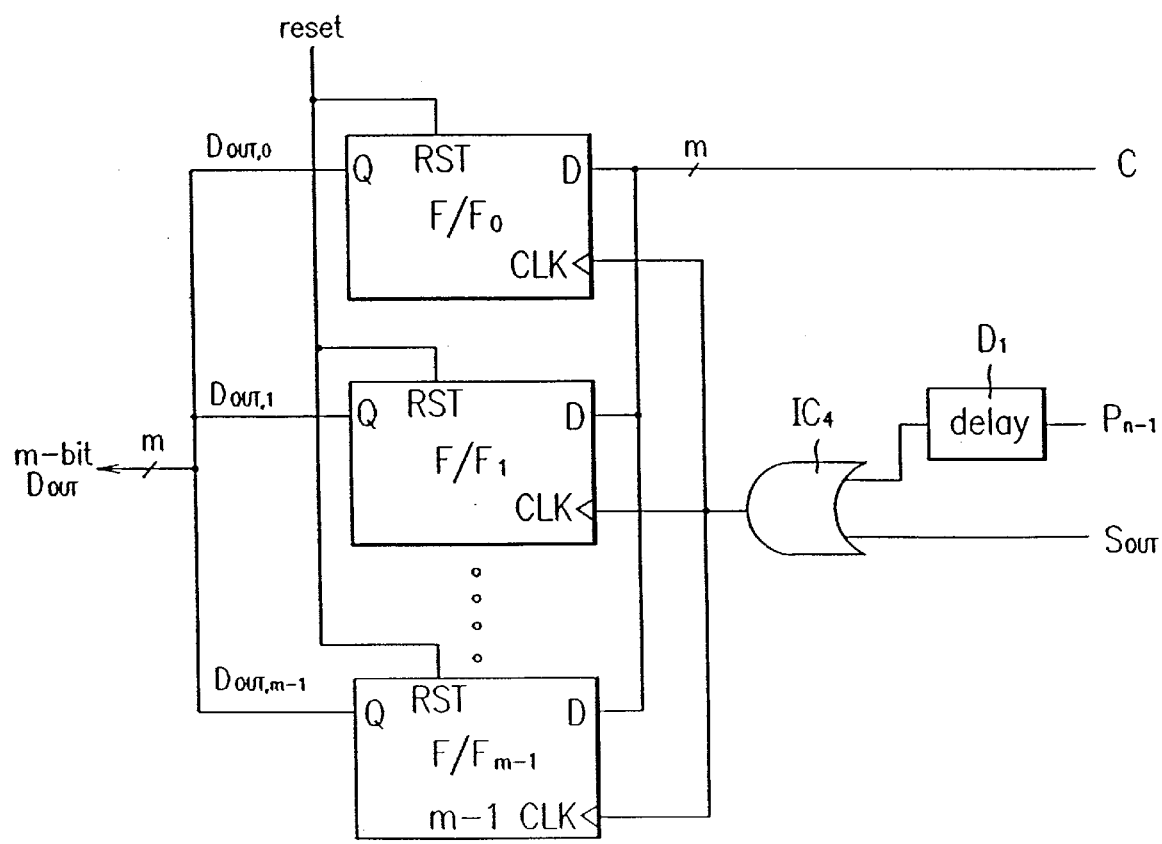
FIG. 7 is a detail circuit of the latching part shown in FIG. 3.

FIG. 4 is a detailed circuit of a first embodiment of the switching part 2 shown in FIG. 3. FIG. 5 is a detailed circuit of a second embodiment of the switching part 2 shown in FIG. 3. FIG. 6 is a detailed circuit of the clock signal controlling part 5 shown in FIG. 3. FIG. 7 is a detailed circuit of the latching part 7 shown in FIG. 3.

Referring to FIG. 4, the switching part 2 includes a plurality of transistors $M_1$, $M_2$, - - -, $M_{n-1}$ (with n=$2^m$) each for switching the plurality of reference voltages from the reference voltage generating part 1 in succession in response to the reference voltage selection signals $P_0$, $P_1$, $P_2$, - - - and $P_{n-2}$ from the controlling part 6. The highest reference voltage selection signal $P_{n-1}$ from the controlling part 6 is not applied to any of the transistors $M_1$ through $M_{n-i}$. An OR gate $IC_1$ subjects the highest reference voltage selection signal $P_{n-1}$ from the controlling part 6, a signal $S_{OUT}$ from the sensing part 4, and a reset signal RESET to a logical operation. A transistor $Q_1$ switches the reference voltages applied to an output terminal thereof from the plurality of transistors $M_1, M_2, ---, M_{n-1}$ in response to a signal from the OR gate $IC_1$. The switching part 2 may include a plurality of pass transistors $PTR_i$ as shown in FIG. 5 in place of the plurality of transistors $M_1, M_2, ---, M_{n-1}$ shown in FIG. 4. Each of the pass transistors produces the reference signal at "high".

Referring to FIG. 6, the clock signal controlling part 5 includes an NOR gate $IC_2$ for subjecting the highest reference voltage selection signal $P_{n-1}$ from the controlling part 6 and the signal $S_{OUT}$ from the sensing part 4 to a logical operation. An AND gate $IC_3$ subjects a start signal START, an external main clock signal CLOCK and a signal from the NOR gate $IC_2$ to a logical operation in applying the clock signal to the controlling part 6.

Referring to FIG. 7, the latching part 7 includes a delay $D_1$ for delaying the highest reference voltage selection signal $P_{n-1}$ for a predetermined time period, an OR gate $IC_4$ for subjecting a signal from the delay $D_1$ and the signal $S_{OUT}$ from the sensing part 4 to a logical operation, and a plurality of flipflops $F/F_0, F/F_1, ---, F/F_{m-i}$ for latching the data from the m-bit counter 9 in the controlling part 6 using a signal from the OR gate $IC_4$ as a clock signal.

FIG. 8 is a block diagram of a data sensing device for a multibit memory cell in accordance with a second embodiment of the present invention. The second embodiment of the data sensing device has a decoder 8a, instead of the ring counter 8, for decoding the plurality of reference signal selection signals in the controlling part 6 of the device for sensing data in a multibit memory cell.

A sensing method for sensing data in a multibit memory cell in accordance with the present invention will now be explained.

FIG. 9 shows threshold levels of an m-bit cell and the corresponding reference voltages in accordance with the present invention, FIG. 10 shows the reference voltage selection in the first embodiment of the present invention, and FIG. 11 shows the reference voltage selection in the second embodiment of the present invention.

As shown in FIG. 9, a value between adjacent threshold levels is taken as the reference voltage. For example, if the threshold levels are 2, 4, 6, 8, the reference voltages may be 3, 5, 7. Accordingly, for an m-bit memory cell, the reference voltage generating part 1 generates $2^m-1$ number of voltages each corresponding to an intermediate value of adjacent threshold voltage levels. The controlling part 6 controls the switching part 2 to output the reference voltages from the reference voltage generating part 1 in succession. Here, if the threshold levels are m-bits, though $2^m-1$ reference voltages are required, the number of the reference voltage selection signals from the controlling part 6 is $2^m$. Therefore, the reference voltages are actually selected by the reference voltage selection signals $P_0, P_1, P_2, ---$ and $P_{n-2}$, not the highest reference voltage selection signal $P_{n-1}$, (with $n=2^m$). More specifically, the controlling part 6 controls the switching part 2 to output the reference voltages in an order of from a lower voltage to a higher voltage as shown in FIG. 10, or from a higher voltage to a lower voltage as shown in FIG. 11, according to the following method.

When the ring counter 8 (FIG. 3) or the decoder 8a (FIG. 8) in the controlling part 6 generates the high reference voltage selection signals in the order of from $P_0$ to $P_{n-1}$, the transistors $M_1, M_2, ---, M_{n-1}$ in the switching part 2 having the high signals applied thereto are turned on to output the reference voltages in the order of from a lower voltage to a higher voltage as shown in FIG. 10. Here, of the reference voltage selection signals from the controlling part 6, the highest reference voltage selection signal $P_{n-1}$ is applied, not to any of the transistors in the switching part 2, but to the OR gate $IC_1$ in the switching part 2, the clock signal controlling part 5 and the latching part 7. Therefore, when the reference voltages are produced in the order of from a lower reference voltage to a higher reference voltage as shown in FIG. 10, the highest reference voltage is produced by the reference voltage selection signal $P_{n-2}$.

In contrast, when the ring counter 8 or the decoder 8a in the controlling part 6 generates the high reference voltage selection signals in the order of from $P_{n-2}$ to $P_0$, and $P_{n-1}$ finally, the transistors $M_1, M_2, ---, M_{n-1}$ in the switching part 2 having the high signals applied thereto are turned on to output the reference voltages in the order of from a higher voltage to a lower voltage as shown in FIG. 11. To reduce the power consumption, it is preferable to produce the reference voltages in the order of from a lower reference voltage to a higher reference voltage as shown in FIG. 10. The reason is that when reading data, the data may be sensed, not always by selecting up to the last reference voltage, but by selecting an intermediate reference voltage.

When the reference voltages are thus applied from the switching part 2 to the control gate of the memory cell 3 in succession, the sensing part 4 controls turning on/off operations. In this instance, a channel is formed between a source region and a drain region of the memory cell 3 when a reference voltage over a threshold level is applied to the control gate. No channel is formed between the source region and the drain region of the memory cell 3 when a reference voltage below a threshold level is applied to the control gate. Accordingly, the sensing part 4 also produces a high signal when a reference voltage over a threshold level is applied to the control gate, and a low signal when a reference voltage below a threshold level is applied to the control gate.

For the detailed explanation, it is assumed that the controlling part 6 applies the reference voltages to the control gate of the memory cell 3 in the order of from a lower reference voltage to a higher reference voltage as shown in FIG. 10. It is also assumed that the memory cell has been programmed in one of the two-bit threshold levels $V_{TH,0}$, $V_{TH,1}$, $V_{TH,2}$ and $V_{TH,3}$, and there are three of the reference voltages $V_{REF,0}$, $V_{REF,1}$ and $V_{REF,2}$ each with a value which falls between two adjacent threshold levels. When the reference voltage $V_{REF,0}$ is applied to the control gate of the memory cell 3 by the switching part 2, the sensing part 4 produces a high signal only when the memory cell is programmed at the threshold level $V_{TH,0}$ because a channel is formed between the source region and the drain region of the memory cell. The sensing part 4 produces a low signal when the memory cell is programmed at one of the remaining threshold levels $V_{TH,1}$, $V_{TH,2}$ and $V_{TH,3}$.

Similarly, when the reference voltage $V_{REF,2}$ is applied to the control gate of the memory cell 3 by the switching part 2, the sensing part 4 produces a low signal when the memory cell is programmed at the threshold level $V_{TH,3}$ because a channel is not formed between the source region and the drain region of the memory cell. The sensing part 4 produces a high signal when the memory cell is programmed at one of the remaining threshold levels $V_{TH,0}$, $V_{TH,1}$ and $V_{TH,2}$.

Accordingly, by determining an output of the sensing part 4 whenever one of the reference voltages is applied to the control gate of the memory cell while increasing the reference voltage from the lowest voltage to the highest voltage in succession according to the aforementioned principle, and by counting a time point when the output of the sensing part 4 is changed to "high", the device of the present invention senses data in the multibit memory cell.

Figure 13:
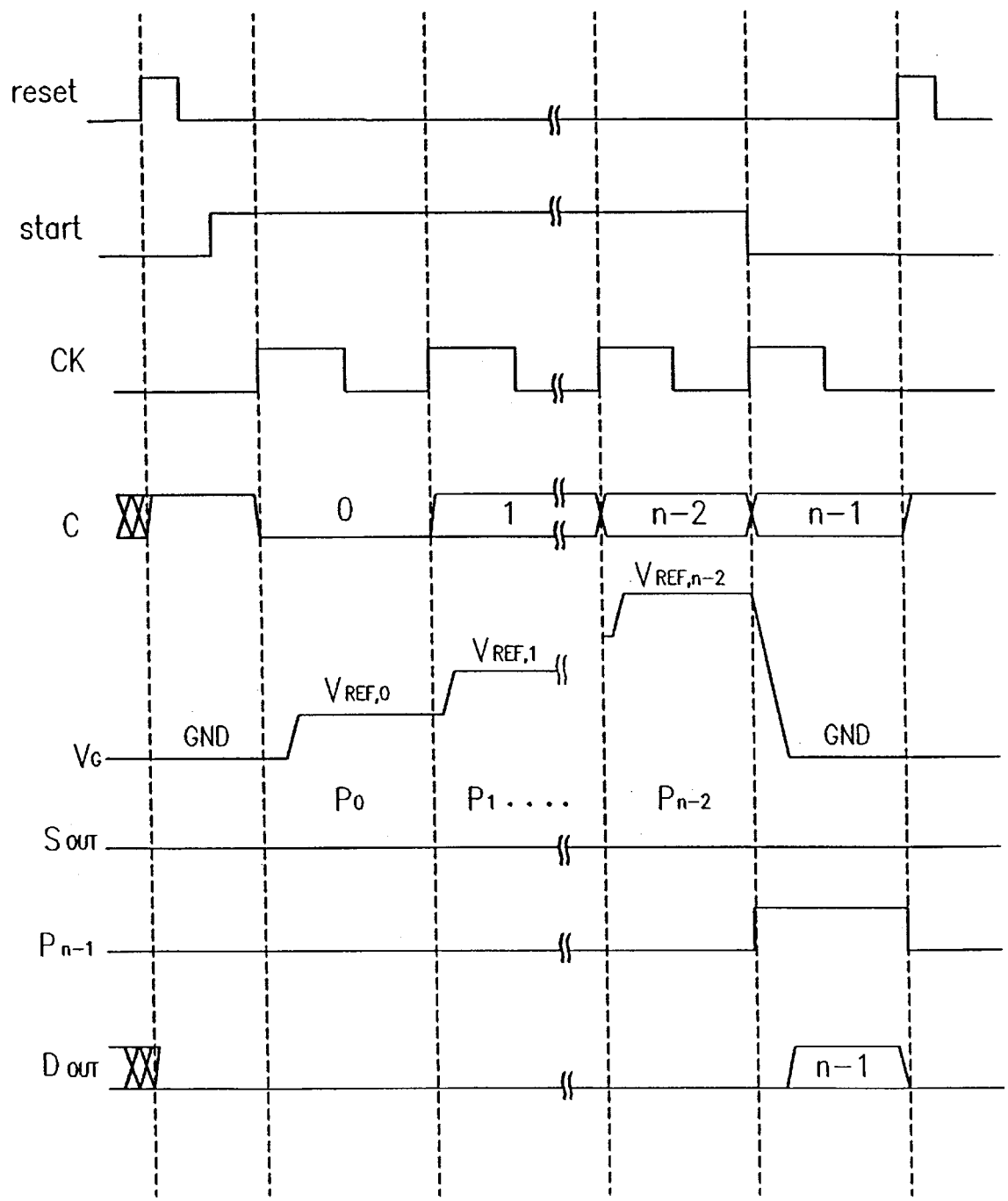
FIG. 13 is a timing diagram of different parts when the highest level data is read according to the present invention.

The sensing method for sensing data in a multibit memory cell in accordance with the first embodiment of the present invention will now be explained with reference to FIGS. 12 and 13. FIG. 12 is the timing diagram of different parts when the memory cell is programmed at a threshold level $V_{TH,2}$, and FIG. 13 is the timing diagram of different parts when the highest level data is read according to the present invention.

Referring to FIG. 12, upon receiving an external main clock signal CLOCK, a reset signal RESET and a start signal START, the clock signal controlling part 5 produces a clock signal to the controlling part 6. The controlling part 6 then counts the clock to generate a reference voltage selection signal and a 2-bit data signal. That is, the ring counter 8 in the controlling part 6 causes the lowest reference voltage $V_{REF,0}$ to be produced and applied to the memory cell 3 through the switching part 2, and the m-bit counter 9 in the controlling part 6 produces a data 00. Upon receiving the reference voltage $V_{REF,0}$, since the memory cell 3 is programmed at the threshold level $V_{TH,2}$, the sensing part 4 produces a low signal. Since both the signal $S_{OUT}$ from the sensing part 4 and the reference voltage selection signal $P_{n-i}$ from the controlling part 6 are at "low", the NOR gate $IC_2$ in the clock signal controlling part 5 produces a high signal, so that the AND gate $IC_3$ in the clock signal controlling part 5 continues to apply the external main clock signal CLOCK to the controlling part 6.

The controlling part 6, counting the clock signal applied thereto continuously according to the aforementioned process, proceeds to the next operation. That is, the controlling part 6 controls the ring counter 8 to produce the reference voltage selection signal $P_1$ at a second rising edge of the clock signal for producing the next reference voltage $V_{REF,1}$. The reference voltage $V_{REF,1}$ is produced in the reference voltage generating part 1 to be applied to the memory cell 3. The m-bit counter 9 then produces the data bits 01. Even if the reference voltage $V_{REF,1}$ is received, the sensing part 4 produces a low signal because the memory cell 3 is programmed at the threshold level $V_{TH,2}$. Since both the signal $S_{OUT}$ from the sensing part 4 and the reference voltage selection signal $P_{n-1}$ from the controlling part 6 are at "low", the NOR gate $IC_2$ in the clock signal controlling part 6 produces a high signal, so that the AND gate $IC_3$ in the clock signal controlling part 5 continues to apply the external main clock signal CLOCK to the controlling part 6. Then, the controlling part 6 controls the ring counter 8 and the m-bit counter 9 to cause the reference voltage $V_{REF,2}$ generated in the reference signal generating part 1 to be applied to the memory cell 3 through the switching part 2 and to produce the data 10 respectively at a third rising edge of the clock signal.

Upon receiving the reference voltage $V_{REF,2}$, the sensing part 4 produces a high signal because the memory cell 3 is programmed at the threshold level $V_{TH,2}$. As the signal $S_{OUT}$ from the sensing part 4 is high, the NOR gate $IC_2$ in the clock signal controlling part 5 produces a low signal regardless of the value of the reference voltage selection signal $P_{n-1}$ from the controlling part 6. Therefore, the AND gate $IC_3$ in the clock signal controlling part 5 applies no external main clock signal CLOCK to the controlling part 6. If no clock signal is applied to the controlling part 6, all the parts of the sensing device are initialized, and the latching part 7 presents the data bits 10 finally produced in the m-bit counter 9 of the controlling part 6 as a sensed data.

According to the aforementioned method, $2^m-1$ level values are sensed except the highest level value in the multilevel programmed memory cell. The highest level value is sensed by the method shown in FIG. 13.

When the memory cell is programmed at the highest threshold level $V_{TH,3}$, even if the controlling part 6 produces a reference voltage selection signal to apply the highest reference voltage $V_{REF,2}$ to the memory cell 3, the sensing part 4 produces a low signal. When the sensing part 4 produces the low signal, the clock signal controlling part 5 continues to apply the external clock signal to the controlling part 6. Then, the ring counter 8 and the m-bit counter 9 in the controlling part 6 respectively count the clock signal to produce the highest reference voltage selection signal $P_{n-1}$ at "high" and to apply the data bits 11 to the latching part 7 at a fourth rising edge of the clock signal, respectively. The NOR gate $IC_2$ in the clock signal controlling part 5 then produces a low signal to stop the application of the external clock signal to the controlling part 6 even if the low signal is under production in the sensing part 4. According to the aforementioned method, the latching part 7 can present a final data bits 11.

The sensing method in accordance with the second embodiment of the present invention is identical to the sensing method of the first embodiment other than the operation of the controlling part 6. That is, the decoder 8a in the second embodiment does not receive the clock signal from the clock signal controlling part 5. Instead, it receives a data signal from the m-bit counter 9 in decoding the reference voltage selection signal.

The data sensing device and method for a multibit memory cell of the present invention has the following advantages. First, since data can be sensed by successive application of reference voltages to a control gate of a multilevel programmed memory cell, the sensing amplifier is only used to determine generation of a voltage in the multibit memory cell. Consequently, the size of the sensing amplifier is minimized. Second, since only one reference voltage of a certain value is applied to the sensing amplifier at one time, the power consumption is reduced.

It will be apparent to those skilled in the art that various modifications and variations can be made in the data sensing device and method for a multibit memory cell of the present invention without departing from the spirit or scope of the invention. Thus, it is intended that the present invention cover the modifications and variations of this invention provided they come within the scope of the appended claims and their equivalents.

What is claimed is:

1. A device for sensing data in a multibit memory cell comprising:

a reference voltage generating part for generating a plurality of reference voltages;

a switching part for successively applying the plurality of reference voltages from the reference voltage generating part to a control gate on the multibit memory cell;

a sensing part for comparing the data recorded in the multibit memory cell to the reference voltages when each reference voltage is applied to the multibit memory cell;

a clock signal controlling part for subjecting a signal from the sensing part and a highest reference voltage selecting signal to a logical operation in controlling an external main clock signal;

a controlling part for generating a plurality of reference voltage selection signals to control the switching part, and applying a highest reference voltage to the clock signal controlling part so that a data signal is produced in response to a clock signal from the clock signal controlling part; and a latching part for latching the data signal from the controlling part.

2. The device as claimed in claim 1, wherein the controlling part includes:

a ring counter for counting the clock signal from the clock signal controlling part, producing the plurality of reference voltage selection signals, and applying the plurality of reference voltage selection signals to the switching part; and an m-bit counter for counting the clock signal from the clock signal controlling part and producing the data signal.

3. The device as claimed in claim 1, wherein the controlling part includes:

a decoder for decoding the plurality of reference voltage selection signals and applying the plurality of reference voltage selection signals to the switching part; and an m-bit counter for counting the clock signal from the clock signal controlling part and producing the data signal.

4. The device as claimed in claim 1, wherein the switching part includes:

a plurality of transistors for switching each of the plurality of reference voltages from the reference voltage generating part in succession in response to the reference voltage selection signals except for the highest reference voltage selection signal, from the controlling part;

an OR gate for subjecting the highest reference voltage selection signal from the controlling part, a signal from the sensing part and a reset signal to a logical operation; and a transistor for switching the plurality of reference voltages applied from the plurality of transistors to an output terminal thereof in response to a signal from the OR gate.

5. The device as claimed in claim 1, wherein the switching part includes a plurality of pass transistors for switching the plurality of reference voltages from the reference voltage generating part in succession in response to the plurality of reference voltage selection signals respectively from the controlling part.

6. The device as claimed in claim 1, wherein the reference voltage generating part generates at most $2^m-1$ reference voltages, m being a number of bits in the multibit memory cell.

7. A device for sensing data in a multibit memory cell comprising:

a reference voltage generator for generating a plurality of reference voltages;

a switch for successively applying the reference voltages from the reference voltage generator to a control gate on the multibit memory cell;

a sensor for comparing the data recorded in the multibit memory cell to the reference voltages when each reference voltage is applied to the multibit memory cell;

a clock signal controlling part for subjecting a signal from the sensor and a highest reference voltage selecting signal to a logical operation in controlling an external main clock signal;

a controlling part for generating a plurality of reference voltage selection signals to control the switch, and applying a highest reference voltage to the clock signal controlling part so that a data signal is produced in response to a clock signal from the clock signal controlling part; and a latch for latching the data signal from the controlling part, wherein the clock signal controlling part includes:

a NOR gate for subjecting a highest reference voltage selection signal from the controlling part and a signal from the sensing part to a first logical operation; and an AND gate for subjecting a start signal, the external main clock signal and a signal from the NOR gate to a second logical operation in applying the clock signal to the controlling part.

8. A device for sensing data in a multibit memory cell comprising:

a reference voltage generator for generating a plurality of reference voltages;

a switch for successively applying the reference voltages from the reference voltage generator to a control gate on the multibit memory cell;

a sensor for comparing the data recorded in the multibit memory cell to the reference voltages when each reference voltage is applied to the multibit memory cell;

a clock signal controlling part for subjecting a signal from the sensor and a highest reference voltage selecting signal to a logical operation in controlling an external main clock signal;

a controlling part for generating a plurality of reference voltage selection signals to control the switch, and applying a highest reference voltage to the clock signal controlling part so that a data signal is produced in response to a clock signal from the clock signal controlling part; and a latch for latching the data signal from the controlling part, wherein the latching part includes:

a delay for delaying the highest reference voltage selection signal;

an OR gate for subjecting a signal from the delay and a signal from the sensing part to a logical operation; and a plurality of flipflops for latching the data signal from the controlling part using a signal from the OR gate as a clock signal.

9. A method for sensing programmed data in a multibit memory cell comprising the steps of:

receiving an external main clock signal;

successively latching data in response to the main clock signal;

successively applying a plurality of reference voltages to a control gate on the multibit memory cell;

sensing the multibit memory cell when each of the plurality of reference voltages is applied to the multibit memory cell;

detecting a time when an output from the sensing step is changed for blocking the main clock signal; and presenting the data latched by a most recent clock signal as the programmed data in the multibit memory cell.

10. The method as claimed in claim 9, wherein a number of the plurality of reference voltages produced is $2^m-1$ when the multibit memory cell is programmed in m-bits, the plurality of reference voltages are produced in an order of from a lower voltage to a higher voltage, and data is latched in an order of from a higher data to a lower data.

11. The method as claimed in claim 9, further comprising the step of presenting a highest data as the programmed data in the multibit memory cell if no output change time is detected in the detecting step even if the highest reference voltage is applied to the memory cell.

12. The method as claimed in claim 9, wherein the step of successively applying a plurality of reference voltages to a control gate on the multibit memory cell applies at most $2^m-1$ reference voltages, m being a number of bits in the multibit memory cell.

13. A device for sensing a data in a multibit memory cell comprising:

a reference voltage generating part for generating a plurality of reference voltages;

a switching part for successively applying the plurality of reference voltages from the reference voltage generating part to a control gate of the multibit memory cell;

a sensing part for comparing the data recorded in the multibit memory cell to the reference voltages when each of the plurality of reference voltages is applied to the multibit memory cell;

a clock signal controlling part for controlling an external main clock signal;

a controlling part for controlling the switching part, and applying a highest reference voltage to the clock signal controlling part so that a data signal is produced in response to a clock signal from the clock signal controlling part; and a latching part for latching the data signal from the controlling part.

14. The device as claimed in claim 13, wherein the controlling part includes:

a ring counter for counting the clock signal from the clock signal controlling part, producing a plurality of reference voltage selection signals, and applying the plurality of reference voltage selection signals to the switching part, and an m-bit counter for counting the clock signal from the clock signal controlling part and producing the data signal.

15. The device as claimed in claim 13, wherein the controlling part includes a decoder for decoding a plurality of reference voltage selection signals and applying the plurality of reference voltage selection signals to the switching part.

16. The device as claimed in claim 13, wherein the reference voltage generating part generates at most $2^m-1$ reference voltages, m being a number of bits in the multibit memory cell.

17. A device for sensing data in an m-bit memory cell comprising:

a reference voltage generator for generating at most $2^m-1$ reference voltages;

a switch for successively applying the at most $2^m-1$ reference voltages from the reference voltage generator to a control gate on the m-bit memory cell;

a sensor for comparing the data recorded in the m-bit memory cell to the reference voltages when each reference voltage is applied to the m-bit memory cell;

a clock signal controller for subjecting a signal from the sensor and a highest reference voltage selecting signal to a logical operation in controlling an external main clock signal;

a controller for generating a plurality of reference voltage selection signals to control the switch, and applying a highest reference voltage to the clock signal controller so that a data signal is produced in response to a clock signal from the clock signal controller; and a latch for latching the data signal from the controller.

18. The device as claimed in claim 17, wherein the controller includes:

a ring counter for counting the clock signal from the clock signal controller, producing the plurality of reference voltage selection signals, and applying the plurality of reference voltage selection signals to the switch; and an m-bit counter for counting the clock signal from the clock signal controller and producing the data signal.

19. The device as claimed in claim 17, wherein the controller includes:

a decoder for decoding the plurality of reference voltage selection signals and applying the plurality of reference voltage selection signals to the switch; and an m-bit counter for counting the clock signal from the clock signal controller and producing the data signal.

20. The device as claimed in claim 17, wherein the switch includes:

a plurality of transistors for switching each of the at most $2^m-1$ reference voltages from the reference voltage generator in succession in response to the reference voltage selection signals except for the highest reference voltage selection signal, from the controller;

an OR gate for subjecting the highest reference voltage selection signal from the controller, a signal from the sensor and a reset signal to a logical operation; and a transistor for switching the at most $2^m-1$ reference voltages applied from the plurality of transistors to an output terminal thereof in response to a signal from the OR gate.

21. The device as claimed in claim 17, wherein the switch includes a plurality of pass transistors for switching the at most $2^m-1$ of reference voltages from the reference voltage generator in succession in response to the plurality of reference voltage selection signals respectively from the controller.

* * * * *